(12) United States Patent
Heller et al.

(10) Patent No.: US 11,781,238 B2
(45) Date of Patent: Oct. 10, 2023

(54) SYSTEMS AND METHODS FOR PLATE-UP DETECTION

(71) Applicant: Applied Materials, Inc., Santa Clara, CA (US)

(72) Inventors: Matthew Heller, Kalispell, MT (US); David W. Bricker, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 413 days.

(21) Appl. No.: 16/859,256

(22) Filed: Apr. 27, 2020

(65) Prior Publication Data

US 2020/0370198 A1 Nov. 26, 2020

Related U.S. Application Data

(60) Provisional application No. 62/850,211, filed on May 20, 2019.

(51) Int. Cl.

| | |
|---|---|
| *C25D 17/00* | (2006.01) |
| *H01L 21/67* | (2006.01) |
| *B08B 13/00* | (2006.01) |
| *H01L 21/66* | (2006.01) |
| *C25D 21/12* | (2006.01) |
| *B08B 1/02* | (2006.01) |
| *G01N 21/47* | (2006.01) |
| *G01N 21/88* | (2006.01) |

(Continued)

(52) U.S. Cl.
CPC ............. *C25D 17/004* (2013.01); *B08B 1/02* (2013.01); *B08B 13/00* (2013.01); *C25D 21/12* (2013.01); *G01N 21/47* (2013.01); *G01N 21/8851* (2013.01); *G01N 21/94* (2013.01); *H01L 21/6723* (2013.01); *H01L 22/12* (2013.01); *C25D 7/12* (2013.01); *C25D 17/001* (2013.01)

(58) Field of Classification Search
CPC ......... B08B 13/00; B08B 1/02; C25D 17/001; C25D 17/004; C25D 21/12; C25D 7/12; C25D 17/005; G01N 21/47; G01N 21/8851; G01N 21/94; G01N 2021/945; G01N 21/8806; H01L 21/6723; H01L 22/12; H01L 21/67242; H01L 21/67253; G01B 11/303
USPC ................ 356/426–428, 445–448, 614–624, 356/399–401
See application file for complete search history.

(56) References Cited

U.S. PATENT DOCUMENTS

| | | | |
|---|---|---|---|
| 7,280,233 B2 * | 10/2007 | Shin ................... | G01N 21/9501 356/614 |
| 9,842,757 B2 | 12/2017 | Hosek et al. | |

(Continued)

FOREIGN PATENT DOCUMENTS

| | | |
|---|---|---|
| JP | 5256003 B2 | 8/2013 |
| JP | 2018-003102 A | 1/2018 |

(Continued)

*Primary Examiner* — Tri T Ton
(74) *Attorney, Agent, or Firm* — Kilpatrick Townsend & Stockton LLP (57) ABSTRACT

Systems for electroplating seal inspection may include a module configured to support a seal for inspection. The module may include a set of supports positioned to contact an interior rim of the seal. The module may be configured to rotate the seal about a central axis. The system may also include a detector positioned on the module. The detector may be positioned to scan an exterior surface of the seal.

15 Claims, 3 Drawing Sheets

(51) Int. Cl.
*G01N 21/94* (2006.01)
*C25D 7/12* (2006.01)

(56) References Cited

U.S. PATENT DOCUMENTS

2011/0058167 A1* 3/2011 Knox ...................... H04N 7/18
                                                      356/338
2014/0265090 A1   9/2014 Hou
2017/0299524 A1* 10/2017 Arora .................... C25D 17/06

FOREIGN PATENT DOCUMENTS

| | | |
|---|---|---|
| JP | 2018-159131 A | 10/2018 |
| KR | 2017-0007167 A | 1/2017 |
| TW | 2011-39250 A | 11/2011 |

* cited by examiner

SYSTEMS AND METHODS FOR PLATE-UP DETECTION

CROSS REFERENCES TO RELATED APPLICATIONS

This application claims the benefit of priority to U.S. Provisional Patent Application No. 62/850,211 filed May 20, 2019, the contents of which are hereby incorporated by reference in their entirety for all purposes.

TECHNICAL FIELD

The present technology relates to plating systems in semiconductor processing. More specifically, the present technology relates to systems and methods for inspecting components and identifying residues from electroplating system operations.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers. One issue during plating is residue buildup on the contact seal against which the substrate may be seated.

Seal cleaning operations may include rinsing, as well as chemical and mechanical cleaning. Cleaning operations may often be performed automatically after a number of wafer cycles in a processing system. By automating the process, ensuring uniformity of cleaning may be difficult and wear on mechanical cleaning elements may increase operating costs. Additionally, determining completeness of cleaning may be challenged as well. When plate-up of metal on the seal begins to occur, automated processes may not identify the effect, and without additional visual inspection, plate-up may increase, thieving deposition material from the substrate, which may lead to substrate damage or loss.

Thus, there is a need for improved systems and methods that can be used to produce high quality devices and structures. These and other needs are addressed by the present technology.

SUMMARY

Systems for electroplating seal inspection may include a module configured to support a seal for inspection. The module may include a set of supports positioned to contact an interior rim of the seal. The module may be configured to rotate the seal about a central axis. The system may also include a detector positioned on the module. The detector may be positioned to scan an exterior surface of the seal.

In some embodiments, the seal may be characterized by an exterior surface profile including a sloped surface extending from a first edge of the sloped surface in contact with a radially inward surface of the seal to a second edge of the sloped surface in contact with a radially outward surface of the seal. The detector may be or include a laser and a receiver mounted on a post extending from a deck plate of the module. The laser may be or include a light beam characterized by a light beam width. The light beam width may be substantially equal to a distance along the sloped surface between the first edge of the sloped surface and the second edge of the sloped surface. The receiver may be configured to receive reflected light of the laser from the seal.

The system may further include a processor communicatively coupled with the detector and configured to receive a sampling of a reflected signal from the detector at a predetermined interval in a primary scanning operation. The processor may be configured to produce a smoothed signal of the sampling of the reflected signal. The processor may be further configured to identify reflected signals above a threshold indicative of residual material disposed on the seal. The processor may be further configured to perform a secondary scanning operation upon identifying reflected signals above the threshold indicative of residual material to verify an outlying reading. Upon verification, the processor may be configured to initiate a cleaning operation of the seal, or cause the seal to be prevented from being repositioned within an electroplating chamber. Identifying reflected signals above the threshold indicative of residual material may further include identifying a first reflected signal above the threshold indicative of residual material and indicative of a first slope change of the smoothed signal. Identifying reflected signals above the threshold indicative of residual material may further include identifying a second reflected signal above the threshold indicative of residual material and indicative of a second slope change in the smoothed signal. The second slope change may be characterized by a reversed slope direction from the first slope change. The system may also include a seal cleaning assembly including an arm pivotable between a first position and a second position, wherein the arm is rotatable about a central axis of the arm, and wherein the seal cleaning assembly includes a cleaning head coupled with a distal portion of the arm.

The present technology may also encompass methods of detecting material plate-up. The methods may include reflecting a laser off an exterior surface of a seal positioned on a module. The methods may include rotating the seal while continuing to reflect the laser. The methods may include sampling a reflected signal to produce a raw data set. The methods may include producing a smoothed signal by reducing noise from the raw data set. The methods may also include determining whether any positional slope on the smoothed signal exceeds a threshold indicative of residual material disposed on the seal.

In some embodiments the threshold indicative of residual material may include a multiple of a median value of the positional slopes. The threshold indicative of residual material comprises an error analysis identifying outlier values from a rolling threshold. The methods may also include identifying a first slope exceeding the threshold indicative of residual material disposed on the seal. The methods may also include determining whether a second slope on the smoothed signal exceeds the threshold indicative of residual material disposed on the seal. The methods may also include identifying a second slope exceeding the threshold indicative of residual material disposed on the seal. The methods may also include determining that plate-up material exists on the seal. The methods may also include repeating the method to verify that plate-up exists on the seal. The methods may also include performing a seal cleaning operation or preventing the seal from being repositioned within an electroplating system.

Such technology may provide numerous benefits over conventional technology. For example, the present technology may provide improved identification of material plate-up on a system seal compared to a visual inspection. Additionally, the inspection may be performed automatically and rapidly, which may provide consistent identification as well as a minimal impact on processing downtime. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductor materials are formed, vias, trenches, and other pathways are produced within the structure. These features may then be filled with a conductive or metal material that allows electricity to conduct through the device from layer to layer. As device features continue to shrink in size, so too does the amount of metal providing conductive pathways through the substrate. As the amount of metal is reduced, the quality and uniformity of the fill may become more critical to ensure adequate electrical conductivity through the device. Accordingly, manufacturing may attempt to reduce or remove imperfections and discontinuities in the pathways.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. The substrate on which metal is being plated operates as the cathode. An electrical contact, such as a ring or pins, may allow the current to flow through the system. This contact may be protected from the electrolyte by a seal, which may prevent metal from being plated on other conductive components. The seal is often a non-conductive material, however, over time the seal may become conductive due to residues formed on the seal during plating operations. During processing, residues may build up on the seal including plating materials, photoresist, or other materials used in processing operations. If the buildup continues, the seal may become sufficiently conductive and plating may occur on the seal. This plating may reduce local plating on the substrate, causing uniformity issues, which may result in scrapped substrates or wafers.

Conventional technologies often halt operations between wafers to clean residues from this seal. The system may be partially disassembled, and the seal may be cleaned and scrubbed manually before being replaced in the tool. This process is time consuming, and abrasive scrubbing may further roughen the seal surfaces increasing the amount of conductive residue that may remain on the seal during processing. Additional automated cleaning operations may also be performed, although automated processes may introduce variables and uncertainty including whether sufficient cleaning agent is being used, whether rinsing operations are being performed, and whether complete cleaning actually occurs.

Plate-up of material on a seal can occur spontaneously during wafer plating, leading to scrapped wafers as noted above. Conventional technologies often include a laborer performing a visual inspection at periodic intervals to limit the effects of plate-up on the seal and wafer loss. However, visual inspection is prone to inconsistency, and a laborer may be incapable of perceiving minute plate-up indicative of additional thieving likely to occur, and which may not be fully removed during cleaning operations. Additionally, visual inspection may be time-consuming, while still being imprecise. The present technology overcomes these issues by performing an automated seal inspection at periodic intervals during processing. The automated seal inspection may perceive minuscule defects in a seal as well as plating beginning to occur, and may provide a check on the completeness of cleaning, as well as a safety mechanism against wafer loss. After describing an exemplary module for exposing and configuring a seal for inspection and cleaning by an apparatus according to embodiments of the present technology, the remaining disclosure will discuss aspects of the systems and processes of the present technology.

It is to be understood that the present technology may not be limited to seal cleaning assemblies alone. The present technology may be applicable in a variety of other applications and technologies including where visual inspection is being performed, as well as where components or methods of the present technology may be useful. For example, the set-up, sensing processes, and other aspects of the present technology may be used in a host of technologies for which properties and characteristics as will be described may be useful either alone or in combination with other aspects of the present technology. Accordingly, the present technology is not to be considered limited by the particular embodiments and combinations described.

Figure 1:
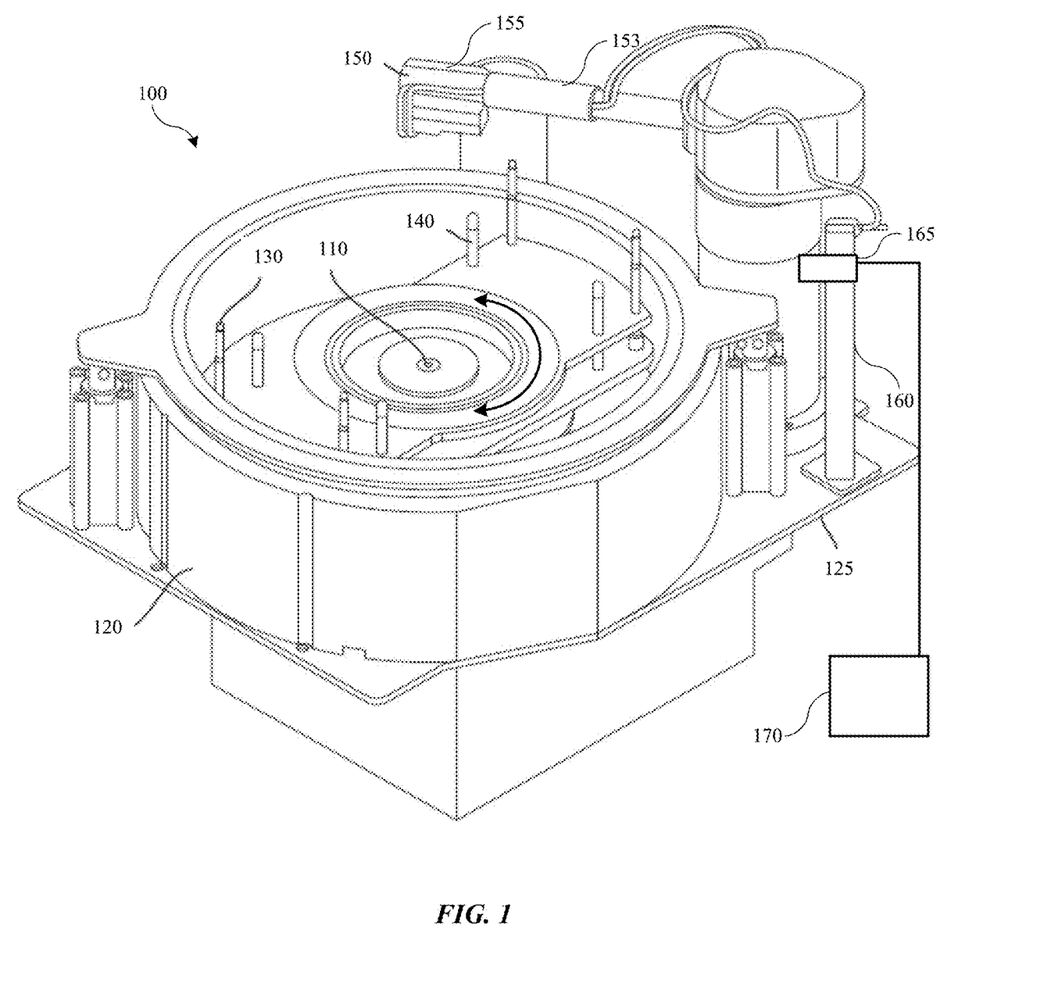
FIG. 1 shows a schematic perspective view of a maintenance module on which inspection technology may be incorporated according to some embodiments of the present technology.

FIG. 1 shows a schematic perspective view of a maintenance module 100 on which cleaning technology may be incorporated according to some embodiments of the present technology. After an electroplating or other processing operation, a seal assembly including a substrate having been processed may be transferred to maintenance module 100. As electroplating may be performed with the seal assembly inverted, the assembly may be rotated upright prior to being positioned in the maintenance module. The seal assembly may be attached to lifter 110 via a hub on the seal assembly. The lifter may be lowered to recess the seal assembly towards or within bowl 120 seated on deck plate 125.

In some embodiments the seal assembly may be or include two main components or subassemblies between which a substrate may be retained and sealed against an outer seal portion of the seal assembly. The two components may be coupled in multiple ways, such as via mechanical couplers, vacuum coupling, magnetic coupling, or other mechanisms by which the components may be removably joined. For an exemplary seal assembly joined magnetically, while being lowered with lifter 110, ring pins 130 or seal supports may engage with the seal assembly, and while the assembly is further lowered, pins 130 may overcome a coupling force to separate the seal assembly and expose a seal to be cleaned. The seal assembly may be further lowered where substrate pins 140 may separate the substrate from a backing plate. A robotic arm may remove the substrate from bowl 120, and a seal cleaning operation may be performed using a seal cleaning assembly 150, which may be rotated within the annular seal, and contacted against the seal to perform a cleaning operation. Pins 130 may engage the seal on an interior surface or rim, which may maintain full exposure on the outer surface for cleaning and inspection. Lifter 110, or other aspects of the system, may be rotatable about a central axis through the bowl or seal being supported, and which may rotate the seal for cleaning or inspection.

The seal may allow isolation of a contact ring from the electrolyte during electroplating operations, and which may prevent plating on a contact ring. The seal may be made of an insulative material, and may be made of materials configured to limit interaction with the electrolyte. For example, the seal material may include a number of polymers including elastomers, and may include fluoropolymers, such as fluoroelastomers, including any FKM materials including Type 1, Type 2, Type 3, Type 4, and Type 5 FKM materials. The materials may also include perfluoroelastomers including any FFKM materials, as well as tetrafluoroethylene/propylene rubbers or FEPM. Seal materials may also include thermoplastic elastomers, including thermoplastic vulcanizates, and elastomers with additional moieties, such as styrene ethylene butylene styrene, as well as materials developed from polyolefins or other plastics. The seal may also include any other materials that may be compatible with electroplating systems and electrolytes.

With the substrate removed, and a seal exposed on ring pins 130, seal cleaning assembly 150 may be positioned within the component, and used to clean the interior of the seal, or the exterior of the seal, which may have plating or other residues on the surface. As illustrated, seal cleaning assembly 150 may include an arm 153, and a cleaning head 155. Arm 153 may be a swing arm or other device associated with the electroplating system or a maintenance module for the seal assembly, and may be pivotable between a number of positions including a first position, which may be retracted, and a second position, which may be an operational position and may position a distal portion of arm 153, with which cleaning head 155 may be coupled, at a location that may be vertically aligned with an interior region or exterior region of the seal exposed in maintenance module 100. Arm 153 may also be rotatable about a central axis of the arm, which may allow the cleaning head to be raised and lowered to an operational position in which the cleaning head may be in contact with a seal. Once positioned against or in contact with the seal, lifter 110 may rotate the seal against cleaning head 155 to perform a chemical, mechanical, or combination cleaning operation.

Additionally attached to module 100 may be a support or post 160 extending vertically or otherwise from the deck plate 125. The post 160 may be positioned away from seal cleaning assembly 150 to limit any clearance issues when arm 153 may be pivoting from a retracted position to an operational position. Attached to post 160 may be a detector 165. Detector 165 may be positioned along post 160 to aim a component of detector 165 towards a seal seated on pins 130, which may allow the detector 165 to scan an exterior surface of the seal. Detector 165 may include a number of different components, and in some embodiments may include a laser and receiver allowing a scanning operation to be performed. Detector 165 may be communicatively coupled with a processing device 170, such as a computer, server, or other computational device. In some embodiments, processing device 170 may be part of a semiconductor processing system server, as well as an internal processing unit of the detector, which may be in communication with a system server. The coupling may be wired or wireless in embodiments, and may provide scanning data to the computer for processing and interpretation as will be described in detail below. Processing device 170 may have one or more processors for controlling any of the noted components. The processors may be communicatively coupled with memory and other storage or networking features. Certain aspects of processing device 170 will be described in more detail below.

Figure 2:
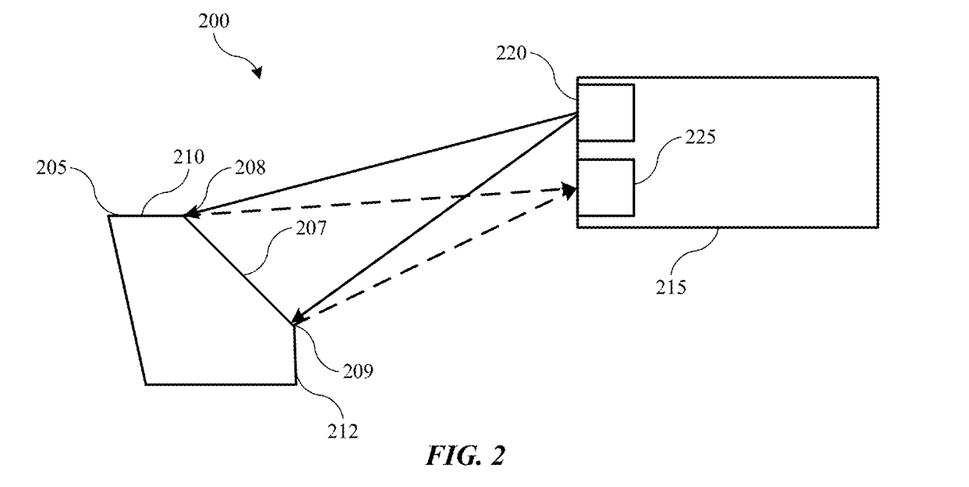
FIG. 2 shows a schematic cross-sectional partial view of a seal inspection system according to some embodiments of the present technology.

Turning to FIG. 2 is shown a schematic cross-sectional partial view of a seal inspection system 200 according to some embodiments of the present technology. Seal inspection system 200 may be components included in module 100 described above, and may include any of the materials or configurations discussed previously. For example, seal inspection system 200 may include a cross-sectional portion of a seal 205, which may be rotating in a module as discussed above, as well as a detector 215, which may be used to scan a surface of seal 205 to identify any non-uniformities in or on the seal.

Seal 205 may be characterized by an exterior surface profile of virtually any geometry, and the present technology is not intended to be limited to any specific profile shapes. The profile illustrated may be encompassed by the present technology, and may facilitate explanation of the coordination of the detector 215 for scanning a sufficient region of the seal. As illustrated, seal 205 may be characterized by an exterior surface profile including a sloped surface 207, which may be characterized by any angle of slope in embodiments. Sloped surface 207 may extend from a first edge 208 to a second edge 209 of the surface. The edges may intersect additional surfaces extending on different planes or angles from sloped surface 207. For example, a inner surface 210 may be a surface radially inward and defining an inner annular radius of seal 205. Inner surface 210 may extend to first edge 208 before transitioning to sloped surface 207. At second edge 209, sloped surface 207 may transition to outer surface 212, which may define an outer annular radius of seal 205 at an external edge of, or along, surface 212. Although illustrated as edges, first edge 208 and second edge 209 may be curved in nature, which may cause a less defined transition between surfaces.

Sloped surface 207 may extend between inner surface 210 and outer surface 212, and may be a surface at least partially exposed within a deposition bath during electroplating operations. As previously explained, plate-up of material may form on sloped surface 207, which may spontaneously occur in areas of the seal, and which may thieve deposition material from a substrate coupled against seal 205. Detector 215 may be used to inspect sloped surface 207 to identify when plating may occur or has occurred, and the detector may be used to produce notification of the plating, or selectively remove the seal from the system, which may limit more precipitous plating on the seal in subsequent processing causing wafer loss.

Detector 215 may include any number of components or systems used to scan a surface of the seal, and which may use any number of scanning techniques. In one exemplary embodiment, detector 215 may include a laser 220 and a receiver 225 within detector 215, and which may be used to scan sloped surface 207, or other surfaces depending on the orientation or setup of the seal and/or detector. It is to be understood that detector 215, or associated components including a processing system, may include any number of additional components to perform the scanning and interpretation as discussed throughout this disclosure. For example, amplifiers and other electronic components to tune and modulate the distributed or received signal may similarly be encompassed by detectors or systems according to the present technology.

Laser 220 may emit a light or other beam source that may impinge on seal 205 along sloped surface 207. For example, in one non-limiting embodiment, laser 220 may emit a red light, which may be reflected from the sloped surface 207 of seal 205. Laser 220 may be configured to produce a beam that extends across sloped surface 207, such as opposed to a spot beam, for example. Because the position of where seal 205 may extend into a plating bath may vary, and because a location of plate-up upon the surface may vary, by emitting a beam that extends across the entire sloped surface 207, more certain readings may be provided by the present technology. Detector 215 may also be positioned at a distance along the deck plate and post with which it is coupled to affect an impact position and amount of spread of the beam across the sloped surface. In some embodiments, the light beam width may be substantially similar or equal to, as well as greater than, a distance along sloped surface 207 between the first edge 208 and the second edge 209.

Receiver 225 may receive a reflected signal from surface 207 as illustrated, which may be reflected light from the seal. Because sloped surface 207, and seal 205 in general, may be a substantially uniform material, the reflected signal may account for any irregularities on the surface, which may include roughness on the seal, cuts or scars on the seal surface, water droplets, or metal, such as any number of metals used in plating, including tin and copper, among a host of other metals and materials. By using a light and receiver system according to embodiments of the present technology, enhanced perception may be achieved over conventional visual inspection as described above.

Figure 3:
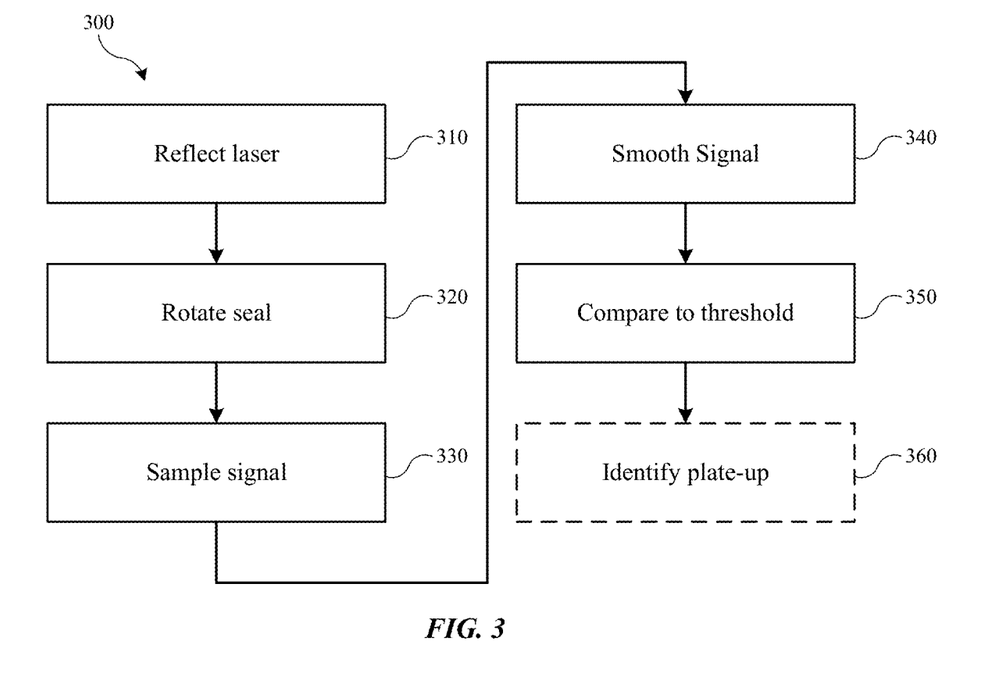
FIG. 3 shows operations of an exemplary method of inspecting a contact seal according to some embodiments of the present technology.

The systems and components previously described may be used in a number of methods for performing seal scanning and for interpreting scanning results. FIG. 3 shows operations of an exemplary method 300 of inspecting a contact seal according to some embodiments of the present technology, and which may use any of the components previously described, such as detector 215. Method 300 may include operations prior to the actual seal inspection in some embodiments. For example, prior to the inspection, a system seal may be positioned to expose a contact seal or other component to be inspected as previously explained with regard to the maintenance module 100 described above. A cleaning operation as noted above may be performed before or after operations of method 300, and method 300 may monitor cleaning or determine the sufficiency of cleaning, along with the overall state of a seal used in electroplating operations.

Method 300 may include a number of operations that may be performed automatically within a system to limit manual interaction, and to provide increased efficiency and precision over manual operations including visual inspection. As noted previously, a laser or light beam may be reflected off an exterior surface of a seal positioned on a module at operation 310, such as a sloped surface 207 of a seal 205 positioned on module 100 as previously described. The seal may be rotated at a particular speed during the scanning with operation 320. The laser may be continued to reflect from the seal surface during the seal rotation, which may be at any speed. The reflected signal may be received by the detector, such as with a receiver as noted above, and sent or collected by a processor or processing system communicatively coupled with the detector as described previously. The processor may receive or collect a sampling signal raw data set of the reflected signal from the detector at a predetermined interval, such as a sampling interval, at operation 330.

This sampling and collection may be performed during a primary scanning operation, which may be performed at any frequency. The seal rotation, sampling frequency, and scanning frequency may all be tuned based on system or fabrication requirements. For example, the seal may be rotated at a speed relative to or in conjunction with a particular sampling speed of the system. The seal may be rotated at a relatively slower speed, which may facilitate sampling and limit the processing power required, although faster rotation and sampling may be performed depending on the capabilities of the system. In one non-limiting example, the seal may be rotated between about 1 and about 10 rpm during sampling. The sampling may be performed at a frequency of between about 1 microsecond and about 100 milliseconds, although faster sampling frequency may be performed depending on the sampling system. Additionally, the sampling may be performed at a frequency between about 1 and about 20 milliseconds, between about 1 and about 10 milliseconds, or any other range or specific frequency within any of these stated ranges.

The received signal data in raw form may include a substantial amount of noise, which may reduce the efficiency of identifying plate-up events. Accordingly, in some embodiments the processor or associated system may produce a smoothed signal of the sampled reflected signal at operation 340. Once a smoothed signal may be produced illustrating a range of slopes as will be explained below, a threshold comparison may be performed at operation 350, which may be used to identify outlying signals indicative of plate-up or residual material disposed on a seal at optional operation 360. These operations will be explained in more detail below.

Figure 4:
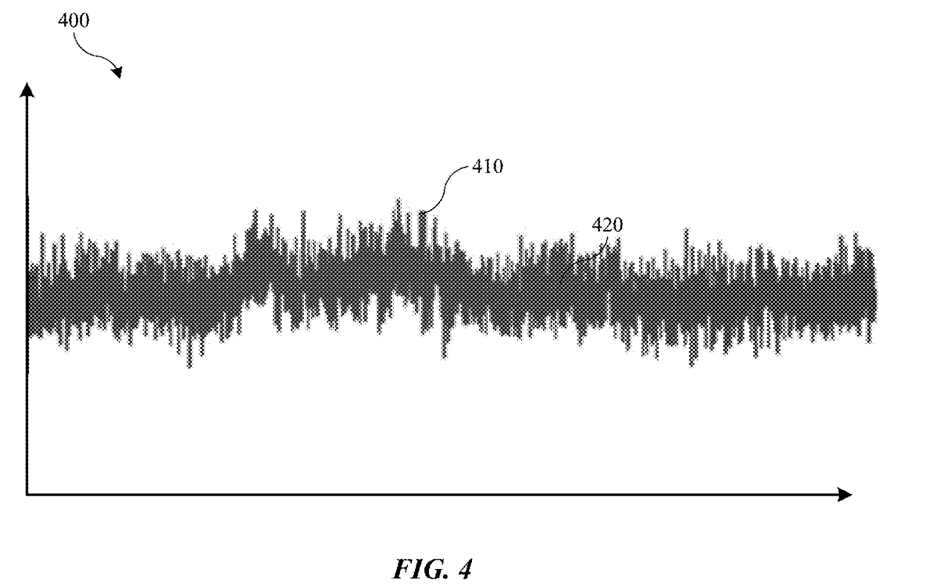
FIG. 4 shows a chart illustrating a raw reflection signal and a smoothed reflection signal according to some embodiments of the present technology.

FIG. 4 shows a chart 400 illustrating a raw reflection signal and a smoothed reflection signal according to some embodiments of the present technology. The illustration plots the intensity of the reflected signal against a scanning time, or potentially a positional distance along a circumference of a seal. Raw signal 410 includes all identified artifacts and reflections from the seal, which may include an amount of noise as illustrated. Additionally, imperfections in the surface of the seal, such as an elastomeric surface, as well as aspects of the light being generated may all produce noise collected by the receiver, and which may obfuscate the detection of plate-up. Accordingly, a smooth signal 420 may be produced by any number of smoothing operations, which may afford further interpretation to discover plating events along the seal relative to other identified objects or events. Any number of smoothing or averaging operations may be performed in embodiments, including a rolling average of discreet and adjacent intensity recordings. For example, a simple average may take a rolling data set of four adjacent samplings and equally weight the intensities to produce a smoother signal, although general averaging may overly sanitize the recorded data, and limit identification of plate-up, which may occur in locations of a few millimeters or less along a surface of the seal. Additional smoothing may unequally weight data points or limit the number of data points being averaged, which may improve some identification, but may also increase the amount of noise maintained in the smoothed signal. Consequently, in some embodiments the smoothing may be performed by a convolution operation.

The convolution may be used in any number of ways to produce a rolling average on the raw signal. In one non-limiting example, a five-point probability distribution, or other sampling number such as between about 3 and about 100 data points, may be produced at each position along the signal readings. In some embodiments, the distribution may be based on between about 10 and about 90 data points, between about 20 and about 80 data points, or within any smaller range encompassed by these stated ranges. Any number of distribution curves may be applied, including a normal distribution. The central data point may be weighted greater than twice as much of any other data point or any data point within two standard deviations, and may be weighted greater than or about three times the weight of any other data point or any data point within two standard deviations, greater than or about five times the weight of any other data point or any data point within two standard deviations, greater than or about seven times the weight of any other data point or any data point within two standard deviations, greater than or about ten times the weight of any other data point or any data point within two standard deviations, or more.

By maintaining the weight of the central data point above or about twice the weight of any other data point or any data point within two standard deviations, deviations across the surface of the seal may be better recognized than when lower averaging is performed, which may overly smooth the data and obscure plating events. In some embodiments the central data point weight may be below or about one hundred times the weight of any other data point or any data point within two standard deviations, which may facilitate reduction in noise from the raw signal. The other data points may be weighted according to the distribution. Any number of distributions, data-point groupings, and other modifications may also be used and are similarly encompassed by the present technology to produce a smoothed signal, such as signal 420 illustrated.

The smoothed signal may include a discrete number of positions producing a line similar to signal 420 as illustrated. By identifying differences along the smoothed signal outside of a threshold value, plate-up along the seal may be determined. For example with the smoothed or reduced data set, an array may be produced based on the difference between every two adjacent samplings, which may be an array of positional slopes of the signal. A second array may be produced of the values in the first array made positive definite. By utilizing a positive definite array, events received as absorptions or scattering of light, which may occur on plate-up of certain metals, may still be identified along with other reflected signals identifying plate-up events.

A threshold comparison may then be performed to identify potential plate-up events using the array data. The threshold may be selected or determined to avoid natural edges that may be identified in a signal, but which may not be an identification of an edge of a plate-up material disposed on the seal. Although any number of thresholding techniques may be performed, in some embodiments a unimodal distribution may be used over a bimodal recognition. Bimodal techniques are premised on the assumption of edges, and then comparing the remaining scale relative to the assumed features. Because the present technology may seek to determine whether an edge on the seal, such as edges of plate-up material, may exist at all, unimodal distribution may be used for the signal thresholding.

Hence, in some embodiments, a median filter may be applied to the positive definite array to identify outlying events. The threshold may be a multiple of a median value of the positional slopes of the array. Accordingly, in some embodiments the threshold may not be a pre-determined value applied to every seal, and instead may be an individualized threshold determined for each seal subsequent scanning and producing the array from which a median may be calculated. Because the technology may be based on reflected light, different seal materials may impact the readings. For example, color variation may occur on seals that are new or old, as well as based on formation techniques. The seal color may impact reflection relative to metal disposed on the seal. Accordingly, if a threshold was pre-determined based on, for example, a perfectly white seal, a lower threshold may be identified based on the more pronounced reflection to a plate-up material. However, if this threshold were applied to a seal that may have yellowed or browned over time, or may have been manufactured differently, the threshold may under or over-report potential-plate ups.

The multiple applied to the median may be any number or decimal that may produce a false-positive identification rate below a certain amount. For example, in some embodiments the threshold may be between about 2 and about 20 times the median of the array, and may be any specific number or range encompassed by this range, such as between about 2 and about 10 times the median, about three times the median, about four times the median, about five times the median, about six times the median, about seven times the median, about eight times the median, about nine times the median, or any other smaller range or decimal of any stated value. In some embodiments, such multiples may produce a rate of less than or about one in one thousand false positive identifications.

In some embodiments a different thresholding technique may be performed, which may include an error analysis identifying outlier values from a rolling threshold. For example, an additional unimodal thresholding technique may include an error calculation applied to a rolling histogram of the data points. For example, a T-point algorithm may be used in which a multi-piece linear regression of the slope of the histogram may be applied, and a distance from the line to each bin of the histogram may be used to calculate error, and identify outliers to the noise, where the outlying values may be locations of plate-up.

Regardless of the thresholding technique, the threshold may be applied to the data array, or to a subset of the array subsequent suppression. For example, all non-peak slopes, such as illustrated as data other than each local maximum on the raw signal 410, may be eliminated to avoid triggering notifications in later steps based on slope comparisons. After non-peak suppression, threshold comparisons may be performed to determine if any positional slope remaining on the smoothed signal exceeds the threshold, which may be indicative of residual or plate-up material disposed on the seal.

The comparative analysis may identify reflected signal peaks above the threshold along the seal. An analysis may identify a first reflected signal above the threshold, which may be indicative of residual material on the seal and indicative of a first slope change of the smoothed signal. However, non-plate-up material may also provide a slope change that exceeds the threshold. For example, residual water may produce a signal. As noted previously, in some embodiments the seal may be made of an elastomeric material on which water may bead. When scanning operations as described extend over a water droplet, the laser may be diffracted up to a particular angle at which point a reflected beam may be produced, followed by further diffraction of the beam. This may produce a single slope exceeding the threshold. Plate-up, however, may form or reflect two companion slopes at both a leading and trailing edge of the plate-up material. Additionally, the slopes tend to be of opposite sign, providing further differentiation.

Figure 5:
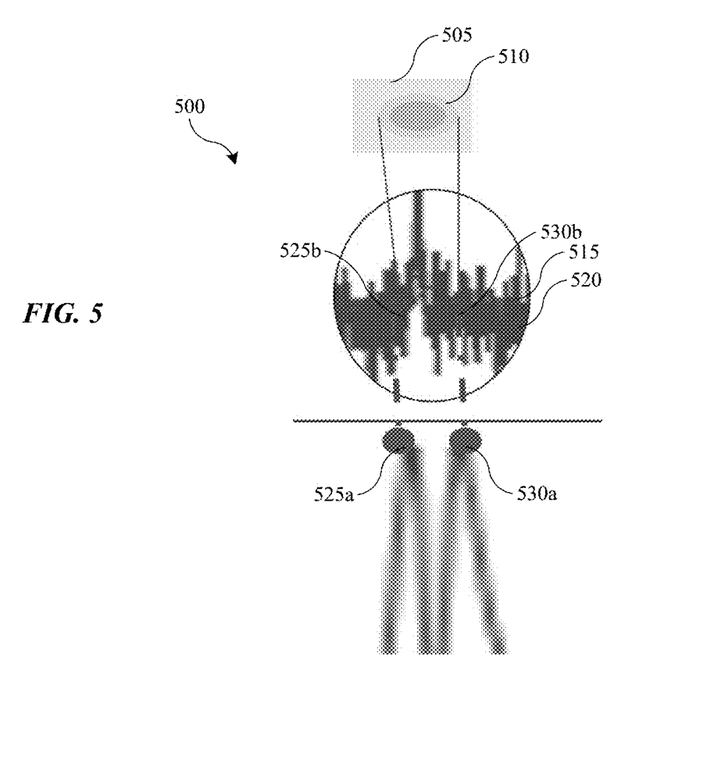
FIG. 5 shows a schematic comparative view identifying plate-up on a seal according to some embodiments of the present technology.

FIG. 5 shows a schematic comparative view 500 identifying plate-up on a seal according to some embodiments of the present technology. As illustrated, seal 505 may include an amount of plate-up material 510, such as a metal disposed on the surface. A scanning operation according to embodiments of the present technology as previously described may produce a raw signal 515, and a smoothed signal 520. Local maxima 525a and 530a may indicate edges of the feature, which may be where the greatest contrast in the reflected signal occurs. This may also indicate the rising slope 525b and falling slope 530b of smoothed signal 520. These rising and falling slopes, which may be reversed when identifying some features, may indicate plate-up relative to other irregularities, such as water droplets, which may be characterized by a single peak.

Accordingly, in some embodiments of the present technology, once a first reflected signal exceeding the threshold has been identified, the methods may also include determining whether a second reflected signal above the threshold exists, which may be indicative of a second slope change in the smoothed signal, and which may also be characterized by a reversed slope from the first slope change. To determine if the slope is of the opposite sign, the values exceeding the threshold on the positive definite array may be compared to the true values in the primary array to ensure one is positive and one is negative in slope. Once this second slope is identified, and if it is within a certain distance of the first slope, the processor may determine that plate-up has occurred at the position along the seal. The distance may be based on plate-up leading to plating issues on a substrate, and thus the distance may be less than or about 1 centimeter, less than or about 9 millimeters, less than or about 8 millimeters, less than or about 7 millimeters, less than or about 6 millimeters, less than or about 5 millimeters, less than or about 4 millimeters, less than or about 3 millimeters, less than or about 2 millimeters, less than or about 1 millimeter, or less.

When the system identifies plate-up, the method may be performed a second time to scan the seal and ensure or verify that plate-up has occurred. Because the entire process may be performed in a few minutes or less, repeating the process may not greatly impact throughput, and may ensure the seal should not be reincorporated within the electroplating system. Subsequent a second scanning operation, as well as or after a first or primary scanning operation, an alarm or notification may be provided that the seal should no longer be used, or should be visually inspected. The processor may also stop operations, such as replacing the seal on the tool for subsequent operations. In some embodiments, a subsequent cleaning operation may be performed with the cleaning system as previously described. Additionally, in some tool setups where backup seals may be included, the seal with verified plate-up may be swapped for a new seal either automatically, or after receipt of the notification to replace the seal provided by the system. The present technology may provide efficient scanning of a seal, such as in less than or about one minute, and may accurately and precisely identify plate-up on a seal. Accordingly, speed of analysis and reductions in wafer loss may be afforded by the present technology.

As previously noted, one or more computing devices or components may be adapted to provide some of the desired functionality described herein by accessing software instructions rendered in a computer-readable form. The computing or processing devices may process or interpret signals from one or more of the components of the present technology, such as the detector, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing devices adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the slope" includes reference to one or more slopes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating seal inspection system comprising:
   a module configured to support a seal for inspection, the module comprising a set of supports positioned to contact an interior rim of the seal, wherein the module is configured to rotate the seal about a central axis, wherein the seal is characterized by an exterior surface profile including a sloped surface extending from a first edge of the sloped surface in contact with a radially inward surface of the seal to a second edge of the sloped surface in contact with a radially outward surface of the seal;
   a detector positioned on the module, wherein the detector is positioned to scan an exterior surface of the seal, wherein the detector comprises a laser and a receiver; and
   a processor communicatively coupled with the detector and configured to receive a sampling of a reflected signal from the detector at a predetermined interval in a primary scanning operation, wherein the processor is configured to produce a smoothed signal of the sampling of the reflected signal and to identify reflected signals above a threshold indicative of residual material disposed on the seal.

2. The electroplating seal inspection system of claim 1, wherein the laser comprises a light beam characterized by a light beam width, wherein the light beam width is substantially equal to a distance along the sloped surface between the first edge of the sloped surface and the second edge of the sloped surface.

3. The electroplating seal inspection system of claim 1, wherein the receiver is configured to receive reflected light of the laser from the seal.

4. The electroplating seal inspection system of claim 1, wherein the processor is further configured to perform a secondary scanning operation upon identifying reflected signals above the threshold indicative of residual material to verify an outlying reading.

5. The electroplating seal inspection system of claim 4, wherein, upon verification, the processor is configured to initiate a cleaning operation of the seal, or cause the seal to be prevented from being repositioned within an electroplating chamber.

6. The electroplating seal inspection system of claim 1, wherein identifying reflected signals above the threshold indicative of residual material further comprises identifying a first reflected signal above the threshold indicative of residual material and indicative of a first slope change of the smoothed signal.

7. The electroplating seal inspection system of claim 6, wherein identifying reflected signals above the threshold indicative of residual material further comprises identifying a second reflected signal above the threshold indicative of residual material and indicative of a second slope change in the smoothed signal, wherein the second slope change is characterized by a reversed slope direction from the first slope change.

8. The electroplating seal inspection system of claim 1, further comprising a seal cleaning assembly including an arm pivotable between a first position and a second position, wherein the arm is rotatable about a central axis of the arm, and wherein the seal cleaning assembly includes a cleaning head coupled with a distal portion of the arm.

9. A method of detecting material plate-up, the method comprising:
   reflecting a laser off an exterior surface of a seal positioned on a module;
   rotating the seal while continuing to reflect the laser;
   sampling a reflected signal to produce a raw data set;
   producing a smoothed signal by reducing noise from the raw data set; and
   determining whether any positional slope on the smoothed signal exceeds a threshold indicative of residual material disposed on the seal.

10. The method of detecting material plate-up of claim 9, wherein the threshold indicative of residual material comprises a multiple of a median value of the positional slopes.

11. The method of detecting material plate-up of claim 9, wherein the threshold indicative of residual material comprises an error analysis identifying outlier values from a rolling threshold.

12. The method of detecting material plate-up of claim 9, further comprising:
   identifying a first slope exceeding the threshold indicative of residual material disposed on the seal; and
   determining whether a second slope on the smoothed signal exceeds the threshold indicative of residual material disposed on the seal.

13. The method of detecting material plate-up of claim 12, further comprising:
   identifying a second slope exceeding the threshold indicative of residual material disposed on the seal; and
   determining that plate-up material exists on the seal.

14. The method of detecting material plate-up of claim 13, further comprising repeating the method to verify that plate-up exists on the seal.

15. The method of detecting material plate-up of claim 13, further comprising performing a seal cleaning operation or preventing the seal from being repositioned within an electroplating system.

\* \* \* \* \*